United States Patent
Lungwitz

(10) Patent No.: US 7,269,032 B2
(45) Date of Patent: Sep. 11, 2007

(54) SHIELDING FOR EMI-SENSITIVE ELECTRONIC COMPONENTS AND OR CIRCUITS OF ELECTRONIC DEVICES

(75) Inventor: Matthias Lungwitz, Bocholt (DE)

(73) Assignee: Siemens Aktiengesellschaft, Munich (DE)

( * ) Notice: Subject to any disclaimer, the term of this patent is extended or adjusted under 35 U.S.C. 154(b) by 298 days.

(21) Appl. No.: 10/535,212

(22) PCT Filed: Jul. 2, 2004

(86) PCT No.: PCT/EP2004/051332

§ 371 (c)(1),
(2), (4) Date: May 16, 2005

(87) PCT Pub. No.: WO2005/004572

PCT Pub. Date: Jan. 13, 2005

(65) Prior Publication Data

US 2006/0027913 A1    Feb. 9, 2006

(30) Foreign Application Priority Data

Jul. 2, 2003  (DE) ............... 103 29 879

(51) Int. Cl.
*H05K 9/00* (2006.01)
(52) U.S. Cl. .............. 361/816; 361/792; 361/760; 257/685; 257/686
(58) Field of Classification Search ........ 361/805, 361/760, 736, 748, 720, 790, 735, 301, 792, 361/761; 324/758, 761; 257/685, 686, 690–692
See application file for complete search history.

(56) References Cited

U.S. PATENT DOCUMENTS 5,157,588 A * 10/1992 Kim et al. ............ 361/736

(Continued)

FOREIGN PATENT DOCUMENTS

DE    199 45 427    11/2000

(Continued)

OTHER PUBLICATIONS

"Printed Circuit Board Pattern Design Method for Law EMI Noise", IBM Technical Disclosure Bulletin, IBM Corp. New York, US BD 37 Nr. 6A, Jun. 1, 1994, p. 603, XP-000455901.

*Primary Examiner*—Tuan T. Dinh
*Assistant Examiner*—Hung S. Bui
(74) *Attorney, Agent, or Firm*—Bell, Boyd & Lloyd LLP

(57) ABSTRACT

A shielding apparatus for EMI-sensitive electronic components, especially for radio transmitting devices and/or radio receiving devices of telecommunication terminals for contactless telecommunication, such as cordless telephones and mobile telephones and similar, which can be constructed without using expensive manufacturing and assembly steps without any extra space requirement. The EMI-sensitive electronic components and/or circuits are arranged on a separate, at least double-layered printed circuit board and are embodied as a printed circuit board module. Said circuit board and another separate, at least two-layered circuit board which includes a recess for the EMI-sensitive electronic components and/or circuits and which is embodied in the form of a base printed circuit board, are joined together by soldering, preferably in the region of contact areas, to form a unit such that a cage is formed by the recess which is disposed between two metal surfaces being respectively connected to the shielding surfaces by means of continuous, highly adjacent contacts. The cage shields the EMI-sensitive electronic components and/or circuits on all sides.

17 Claims, 2 Drawing Sheets

U.S. PATENT DOCUMENTS

| | | | | |
|---|---|---|---|---|
| 5,198,963 A | * | 3/1993 | Gupta et al. | 361/715 |
| 5,895,884 A | | 4/1999 | Davidson | |
| 6,172,423 B1 | * | 1/2001 | Lee | 257/780 |
| 6,486,534 B1 | | 11/2002 | Sridharan et al. | |
| 6,639,304 B1 | * | 10/2003 | Oggioni et al. | 257/660 |
| 7,102,896 B2 | * | 9/2006 | Ajioka et al. | 361/816 |

FOREIGN PATENT DOCUMENTS

| | | |
|---|---|---|
| EP | 0 735 811 | 10/1996 |
| EP | 0 886 464 | 12/1998 |
| EP | 0 977 298 | 2/2000 |
| JP | 09036512 | 7/1997 |
| JP | 10112517 | 4/1998 |
| JP | 2001237586 | 8/2001 |

* cited by examiner

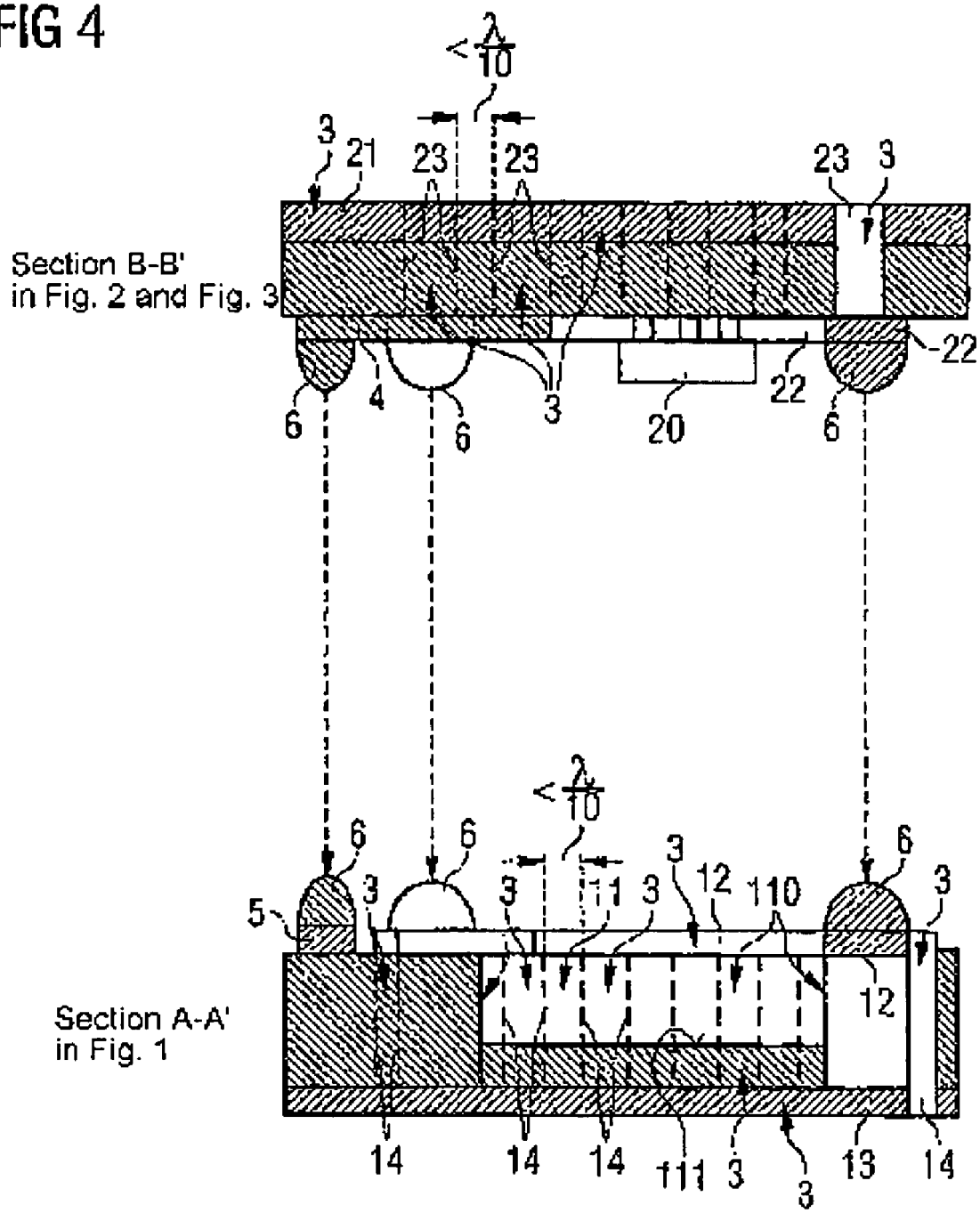

SHIELDING FOR EMI-SENSITIVE ELECTRONIC COMPONENTS AND OR CIRCUITS OF ELECTRONIC DEVICES

FIELD OF TECHNOLOGY

The present invention relates to shielding for EMI-sensitive electronic components and/or circuits of electronic devices, in particular for radio transmitting devices and/or radio receiving devices of telecommunication terminal devices for wireless telecommunication, such as cordless telephones, mobile telephones and the like.

BACKGROUND

Electronic devices predominately have a single printed circuit board from which device functions are performed. In the case of devices having more than two printed circuit boards, modular technology is used with regard to the structure of the printed circuit board. Modular technology is preferably used in cases when the circuits and/or components in the electronic device place different requirements on the printed circuit board. The term "circuits" encompasses circuit components, circuit elements such as conductive track structures, etc., and/or circuit wiring between the circuit components, or between the circuit components or circuit elements and the structural elements.

As an example, in a high-frequency (HF) device including electronic HF circuits and HF components as well as low frequency (LF) circuits and LF components, the LF circuits and components may, for economic reasons, be integrated on a printed circuit board which, unlike the printed circuit board for the HF circuits and components, needs to meet lower requirements with respect to circuit board quality because of the less critical physical characteristics of the LF circuits and components. Accordingly, the printed circuit board with the HF circuits and components will typically appear as a multilayer (e.g., FR4) printed circuit board, whereas the printed circuit board with the LF circuits and components will typically appear as a different multilayer printed circuit board (e.g., FR2, FR3).

To minimize the electromagnetic radiation into and from the HF circuits and components on the FR4 printed circuit board module, in addition to the improved printed circuit board material for the HF module, a shielding element is used that shields the EMI-sensitive electronic components and/or circuits themselves or the entire FR4 printed circuit board module.

To shield electronic components and/or circuits susceptible to Electro-Magnetic Interference (EMI)—such as high-frequency (HF) components and/or high-frequency (HF) circuits used in radio transmitting/receiving devices metal and/or ceramic shielding elements, which shield the EMI-endangered electronic components and/or circuits themselves or the entire printed circuit board, are additionally placed on the printed circuit board of the EMI-sensitive electronic components and/or circuits; to shield the EMI-sensitive electronic components and/or circuits themselves, or the entire printed circuit board.

Examples, of shielding housings or shielding devices are disclosed in U.S. Pat. No. 5,895,884, EP 0 886 464 A2, EP 0 735 811 A2 and DE 199 45 427 C1, and are incorporated by reference in their entirety herein.

In the case of cordless telephones it is known, for example, to provide or configure the housing as a whole, or the frame or lid of the housing, with shielding elements, or to cover the HF components and/or HF circuits with cup- or pot-shaped metal shielding elements.

It is also known in the prior art to shield HF components and/or HF circuits with resistance pastes and so-called Gore foils, the Gore foils generally being used to shield capacitors.

With the known shieldings for high-frequency electrical components and/or circuits, the use of additional shielding elements is disadvantageous because, firstly, additional manufacturing and assembly steps are required and, secondly, the space requirement of the high-frequency electrical components and/or circuits is increased by shielding configured in this way.

Accordingly, there is a need to provide shielding for EMI-sensitive electronic components and/or circuits of electronic devices, in particular for radio transmitting devices and/or radio receiving devices of telecommunication terminal devices for wireless telecommunication, such as cordless and mobile telephones and the like, that can be manufactured without complex and expensive manufacturing and assembly operations and without an additional space requirement.

BRIEF SUMMARY

One exemplary embodiment disclosed herein arranges EMI-sensitive electronic components and/or circuits of electronic devices on a separate, preferably double-layered, printed circuit board that is preferably in the form of a printed circuit board module. This printed circuit board also includes a further separate, at least double-layered printed circuit board, preferably in the form of a base printed circuit board carrying non-EMI-sensitive electronic components and/or circuits. A recess is also provided for the EMI-sensitive electronic components and/or circuits, where they are preferably joined together by soldering and preferably in the region of contact areas, to form a unit, such that a cage is formed by the recess arranged between two metal layers (printed circuit board layers) that are configured as earth faces, each earth face being connected to the contact areas via very closely spaced interfacial connections, with the cage shielding the EMI-sensitive electronic components and/or circuits on all sides.

The contact area may either be formed by the interfacial connections leading to it, or it may additionally have a shielding face that is connected to the interfacial connections leading to the contact area.

In the printed circuit board module, the earth face, which almost completely covers the printed circuit board module, is preferably located on the side facing away from the EMI-sensitive components and/or circuits, and the contact area, which encompasses the components and/or circuits, is preferably located on the components side and/or circuits side. On the base printed circuit board, the contact area, which encompasses the recess, is preferably located on the printed circuit board side having the recess opening and the earth face, the area of which extends beyond the base surface of the recess or is identical with it, is preferably located on the side of the printed circuit board facing away from the recess opening.

When the two printed circuit boards are joined together, preferably in the region of the contact areas (if the two printed circuit boards are located one above the other), the EMI-sensitive electronic components and/or circuits disappear in the recess. In the assembled state, the shielding cage is formed by very closely spaced interfacial connections, which are separated preferably by a distance of less than one-tenth of the wavelength λ of an electromagnetic radiation emitted by electronic components/circuits, which interfacial connections connect the earth face for each printed circuit board with the respective contact area.

This arrangement has the advantage that the printed circuit board module to be shielded does not require any further external shielding device, so that additional material costs are not incurred because comparable shielding is achieved by the cage formed by the two printed circuit boards with the recess, the interfacial connections, the earth faces and the contact areas. Furthermore, any repair that may be needed is now possible on the printed circuit board module because no shielding is present at this stage of manufacturing. This facilitates the inspection of solder points on the module in the context of quality assurance and fault tracing. The overall height of the printed circuit board module is also reduced since no additional shielding device is required on the printed circuit board module.

Because the existing base printed circuit board is also used as shielding for a printed circuit board module with EMI-sensitive electronic components and/or circuits, the use of an additional shielding device is dispensed with. In this case it is less material whether the printed circuit board module is fitted to the base printed circuit board, or whether the base printed circuit board is fitted to the printed circuit board module. This means that if, in the first case, the adhesion force of some components and/or circuits is insufficient on repeated soldering, so that they become detached from the solder pad, then the base printed circuit board is fitted to the printed circuit board module.

Shielding for EMI-sensitive electronic components and/or circuits is especially advantageous in such telecommunication terminal devices for wireless telecommunication in which an HF module, e.g. a radio transmitting and/or radio receiving device, or other circuit parts with high clock frequencies, e.g. a microprocessor, are used.

BRIEF DESCRIPTION OF THE DRAWINGS

Further details, features and advantages of the invention are elucidated in more detail below with reference to the exemplary embodiment illustrated in FIGS. 1 to 4, in which:

FIG. 4 shows sectional representations of the first printed circuit board according to FIG. 1 along the section line A-A', viewed in the direction of the arrows, and of the second printed circuit board according to FIGS. 2 and 3 along the section line B-B', viewed in the direction of the arrows in each case.

DETAILED DESCRIPTION

Figure 1:
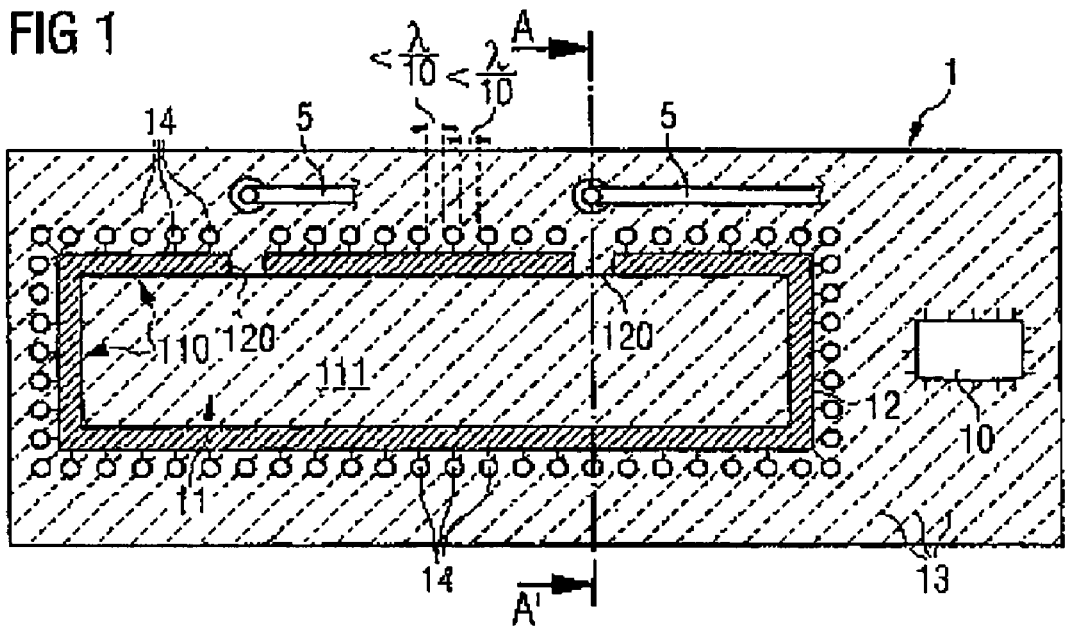
FIG. 1 is a view from the components side and/or circuits side of a first printed circuit board designed for non-EMI-sensitive electronic components and/or circuits in the form of a base printed circuit board.

FIG. 1 shows a top view of a preferably double-layered first printed circuit board 1 in the form of a base printed circuit board which on one side comprising a first printed circuit board layer has a non-HF-component 10, preferably in the form of a surface mounting device and representative of a multiplicity of non-EMI-sensitive electronic components and/or circuits, and on an opposed side comprising a second printed circuit board layer has a first earth face 13, preferably extending over the entire area of the printed circuit board 1. However, as explained below, other embodiments are possible as well. Because the earth face 13 cannot be seen in FIG. 1 as a result of the top view representation of the printed circuit board 1, it is represented by broken lines in FIG. 1. The earth face 13 may be configured either as a continuous surface or as a grid surface with a grid line spacing of less than one-tenth of the wavelength λ of an electromagnetic radiation emitted by electronic components/circuits.

Alternatively, it is also possible, although not explicitly shown in FIG. 1, for the above-mentioned non-HF-component 10, or other components and/or circuits, to be arranged on the second printed circuit board layer with the earth face 13, although separated from the latter. It is also possible for the printed circuit board 1 to have more than two layers.

An opening 110 of a recess 11, let into the printed circuit board 1, 15 located on the components side and/or circuits side of the first layer of the printed circuit board 1, in addition to the non-HF-component 10. Recess 11 has a base surface 111 located between the first layer on the components side and/or circuits side of the printed circuit board 1, and the second layer on the side of the printed circuit board facing away from the components side and/or circuits side.

The surface areas of the base surface 111 and of the earth face 13 are preferably configured so that the earth face 13 in the second printed circuit layer corresponds at least to the area of the base surface 111 of the recess 11. It is also possible that the earth face 13, instead of being arranged in the second printed circuit board layer, is located between the second layer and the base surface 111 or even in the plane of the base surface 111 itself, provided it is ensured in each case that no circuit lines or conductive tracks are disposed between the base surface 111 and the earth face 13. Attention must be paid to this especially in the case of printed circuit boards having more than two layers.

In the first layer of the printed circuit board 1, the opening 110 of the recess 11 has, for shielding purposes, a metal edge configured as a first shielding face 12 that will be explained in more detail below in the description of FIG. 4. Provided in the edge of the opening or in the shielding face 12 are first gaps 120 for external lines 4 (cf. FIG. 2) that are preferably constructed so that external lines 4 can be connected to signal lines 5 located outside the shielding face 12 in the first layer of the printed circuit board 1 without touching the shielding face 12 (i.e., without having contact with the shielding face 12).

The metal edge of the opening or the shielding face 12 is also electrically connected to a multiplicity of preferably resin-filled first interfacial connections 14 which, except for the zone of the gaps 120, are arranged on the printed circuit board 1 beyond (outside) the entire shielding face 12. The distance between two neighboring interfacial connections 14 on the printed circuit board 1 is less than λ/10, where λ is the wavelength of the electromagnetic radiation emitted by electronic components/circuits.

In the printed circuit board 1 illustrated in FIG. 1, the interfacial connections 14 extend from the first printed circuit board layer to the second printed circuit board layer and connect the shielding face 12 in the first layer to the earth face 13 in the second layer. It is noted that if the earth face 13 is not located in the second printed circuit board layer but in a different layer which, for example, is not an external layer, the interfacial connections 14 extend preferably only as far as this other layer.

Alternatively to the structure of the printed circuit board 1 described and illustrated, in which the shielding face 12 and the interfacial connections 14 form a first contact area 12, 14, it is also possible to dispense with the shielding face 12. In this case the contact area 12, 14 is formed by the interfacial connections 14 which lead with one end into the contact area while their other ends are connected to the earth face 13.

Figure 2:
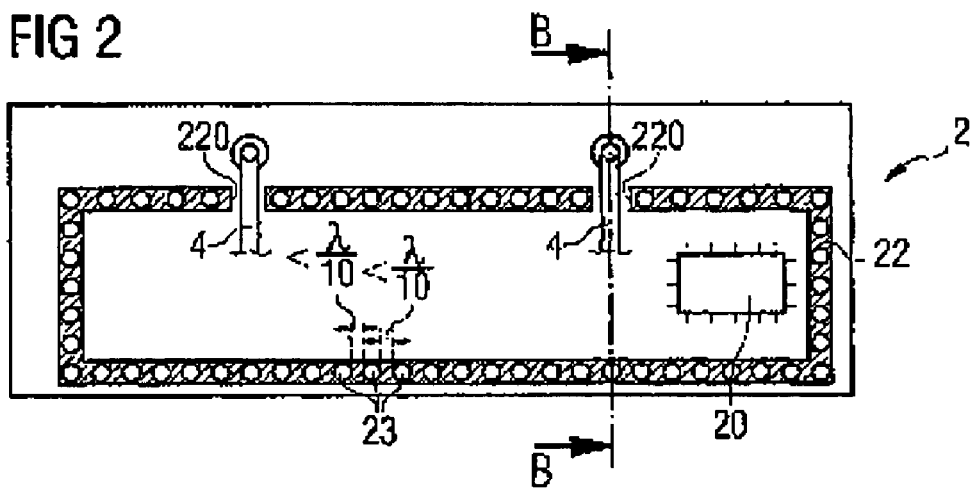
FIG. 2 is a view from the components side and/or circuits side of a second printed circuit board designed for EMI-sensitive electronic components and/or circuits in the form of a printed circuit board module.

FIG. 2 illustrates a top view of the preferably double-layered printed circuit board 2 in the form of a printed circuit board module that has on one side comprising a first layer an HF component 20, preferably again in the form of a surface mounting device and representative of a multiplicity of EMI-sensitive electronic components and/or circuits. On an opposing side of the board is a second layer having a second earth face 21. Since the earth face 21 cannot be seen in FIG. 2 as a result of the top view representation of the printed circuit board 2, the earth face 21 and its extension on the printed circuit board 2 is shown separately in FIG. 3. The earth face 21 may again preferably be configured either as a continuous surface or as a grid surface with a grid line spacing of less than one-tenth of the wavelength $\lambda$ of an electromagnetic radiation emitted by electronic components/circuits.

Again, it is further possible for the printed circuit board 2, like the printed circuit board 1, to have more than two layers.

Located in the first layer of the printed circuit board 2 on the components side and/or circuits side, in addition to the HF-component 20, is a second shielding face 22 which again serves the purpose of shielding to be explained in more detail in the description of FIG. 4 shielding face 22 corresponds substantially, with respect to shape, dimensions, extent and material, to the first shielding face 12 shown in FIG. 1.

Accordingly, shielding face 22, like shielding face 12, has in the same place second gaps 220 that correspond substantially to the first gaps 120.

In the shielding face 22 the gaps 220 are provided for signal lines 4 which correspond to the external lines mentioned in the description of FIG. 1 and which do not touch the shielding face 22 (i.e., have no contact with the shielding face 22).

In addition, the shielding face 22 is preferably electrically connected—like the first shielding face 12 with the first interfacial connections 14 in FIG. 1—to a multiplicity of preferably likewise resin-filled, second interfacial connections 23 that, with the exception of the zone of the gaps 220, are arranged on the printed circuit board 2 in the zone of the entire shielding face 22, unlike the situation in FIG. 1, i.e. not beyond (outside) the entire shielding face 12 on the printed circuit board 1.

Alternatively, however, it is also possible for the interfacial connections 23 to be arranged, like the interfacial connections 14, beyond (outside) the entire shielding face 22 on the printed circuit board 2. Conversely, however, it is also possible for the interfacial connections 14 in FIG. 1, like the interfacial connections 23 in FIG. 2, to be arranged in the zone of the entire shielding face 12 on the printed circuit board 1.

The distance between two neighboring interfacial connections 23 on the printed circuit board 2 is again less than $\lambda/10$, $\lambda$ being the wavelength of the electromagnetic radiation emitted by electronic components/circuits.

In the printed circuit board 2 shown in FIG. 2 the interfacial connections 23 extend from the first printed circuit board layer to the second printed circuit board layer and connect the shielding face 22 in the first layer to the earth face 21 in the second layer. It is noted that if the earth face 21 is not located in the second printed circuit board layer, but perhaps in a different layer (e.g., is not an external layer), the interfacial connections 23 extend preferably only as far as this other layer.

Alternatively to the structure of the printed circuit board 2 described and illustrated, in which the shielding face 22 and the interfacial connections 23 form a second contact area 22, 23, it is also possible to dispense with the shielding face 22. In this case the contact area 22, 23 referred to is formed solely by the interfacial connections 23 which lead with one end to the contact area 22, 23 while their other ends are connected to the earth face 13.

Figure 3:
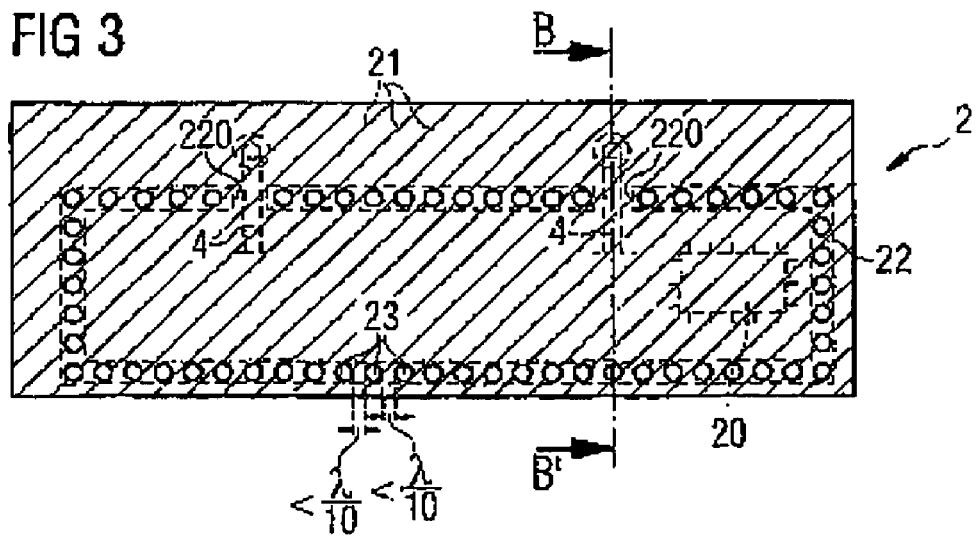
FIG. 3 is a view of the side of the printed circuit board facing away from the components side and/or circuits side of the second printed circuit board designed for EMI-sensitive electronic components and/or circuits in the form of a printed circuit board module.

FIG. 3, based on FIG. 2, shows a top view of the preferably double-layered second printed circuit board 2, configured as a printed circuit board module, and includes on the side with the second layer the second earth face 21 and on the opposed side with the first layer the HF component 20 representing the multiplicity of EMI-sensitive electronic components and/or circuits. Because the HF component 20 and the signal lines 4 cannot be seen in FIG. 3 as a result of the top view representation of the printed circuit board 2, they are represented by broken lines in FIG. 3.

In FIG. 3 the interfacial connections 23 are not drawn with broken lines because they are not hidden by the earth face 21 and therefore are visible. The reason is that for process reasons the interfacial connections 23 are only produced by drilling the printed circuit board 2 at the end, i.e. after applying the earth face 21 to the second layer of the printed circuit board 2.

FIG. 4 illustrates a cross-sectional/exploded view in which the first printed circuit board 1 (FIG. 1) is represented in the unconnected state (exploded state) along the section line A-A', viewed in the direction of the arrows, and the second printed circuit board 2 according to FIGS. 2 and 3 is represented in the unconnected state (exploded state) along the section line B-B', viewed in the direction of the arrows.

The first printed circuit board 1 is preferably configured as the base printed circuit board. It can be seen from FIG. 4 how the recess 11, with the base surface 111 and the recess opening 110, is let into the printed circuit board 1 and how the earth face 13, the first shielding face 12 encompassing the recess opening 110 and the first interfacial connections 14 spaced from one another at a distance of less than $\lambda/10$, together with the recess 11, form a first part of a shielding cage 3—so to speak, a shielding cage 3 without a lid—in relation to the first printed circuit board 1.

With regard to the second printed circuit board 2, preferably configured as a printed circuit board module, it can be seen how the earth face 21, the second shielding face 22 that is substantially congruent to the first shielding face 12 in FIG. 1 and the second interfacial connections 23, again spaced from one another by a distance of less than $\lambda/10$, form a second part of the shielding cage 3 (i.e., the lid of the shielding cage 3) and how the HF component 20 disappears in the recess 11 and therefore in the shielding cage 3 which shields the HF component 20 on all sides, if the second printed circuit board 2 is placed on the first printed circuit board 1 in the direction of the broken arrows.

In the state in which the two printed circuit boards 1, 2 are disposed one above or on the other or in contact in the area of the shielding faces 12, 22, they are preferably joined together by means of solder balls 6 in the region of said shielding faces 12, 22. Alternatively, however, other joining techniques achieving the same effect (adhesion effect) as soldering, e.g. bonding, are also possible.

If the shielding faces are not present, as indicated above, the two printed circuit boards 1, 2 are joined, in the state specified, in the region of the interfacial connections 14, 23 a shown in FIG. 4. Alternatively, however, it is also possible to join the two printed circuit boards 1, 2 in the specified state outside the contact areas 12, 14, 22, 23.

With the soldered or bonded joining of the two printed circuit boards 1 the signal lines 4, 5 are also joined to one another. Because of the necessary electrical connection, soldering by means of the solder balls 6 is preferably used as the joining means. Should other possible joining techniques also be considered here, it is only necessary to take care that the alternative joining technique ensures an electrical connection between the signal lines.

The above described description and drawings are only to be considered illustrative of exemplary embodiments, which achieve the features and advantages of the invention. Modifications and substitutions to specific process conditions and structures can be made without departing from the spirit and scope of the invention. Accordingly, the invention is not to be considered as being limited by the foregoing description and drawings, but is only limited by the scope of the appended claims.

The invention claimed is:

1. A shielding apparatus for EMI-sensitive components, comprising:
a first circuit board, having a plurality of layers having interfacial connections, said first circuit board including a first base surface and a recess opening on one layer in which non-EMI-sensitive components are arranged;
a first contact area encompassing the recess opening;
a first earth face, which corresponds to an area of the base surface and the recess opening, wherein the non-EMI-sensitive components are arranged outside the first contact area or the first earth face;
a second circuit board, having a plurality of layers having interfacial connections, said second board including a second base surface on one layer in which EMI-sensitive components are arranged;
a second contact area encompassing the EMI-sensitive components; and
a second earth face, corresponding to an area of the second base surface,
wherein the first and second circuit board are coupled via joining means, and wherein said EMI-sensitive components are arranged within the recess opening of the first printed circuit board, and wherein at least some of the interfacial connections, together with the recess and the first and second earth faces, form a cage in which the EMI-sensitive components are shielded.

2. The shielding apparatus of claim 1, wherein the first earth face is disposed between the recess opening of the first base surface and a side of the circuit board facing away from the recess opening.

3. The shielding apparatus of claim 1, wherein the first earth face is disposed in a plane of the first base surface.

4. The shielding apparatus of claim 1, wherein the first earth face is disposed in a plane of a side of the circuit board facing away from the recess opening.

5. The shielding apparatus of claim 1, wherein the second earth face is disposed between the EMI-sensitive component circuit board layer and a side facing away from the EMI-sensitive component circuit board layer.

6. The shielding apparatus of claim 1, wherein the second earth face is disposed in a plane of a side facing away from the EMI-sensitive component circuit board layer.

7. The shielding apparatus of claim 1, wherein the interfacial connections are spaced apart by a distance less than one-tenth of the wavelength ($\lambda$) of an electromagnetic radiation emitted by the components.

8. The shielding apparatus of claim 1, wherein the interfacial connections pass through their respective earth faces.

9. The shielding apparatus of claim 1, wherein the interfacial connections are filled with a filling material.

10. The shielding apparatus of claim 9, wherein the filling material is resin-based.

11. The shielding apparatus of claim 1, wherein the interfacial connections are connected to each respective earth face and to a respective contact area.

12. The shielding apparatus of claim 11, further comprising two gaps between the second contact area and a respective interfacial connection having first signal lines, wherein said signal lines transmit signals to and from the EMI-sensitive components on the second circuit board.

13. The shielding apparatus of claim 12, further comprising two gaps between the first contact area and a respective interfacial connection having second signal lines, wherein said second signal lines are coupled to the first signal lines outside the recess opening.

14. The shielding apparatus of claim 1, wherein the earth faces are configured as continuous faces.

15. The shielding apparatus of claim 1, wherein the earth faces are configured as grid faces, with grid line spacing of less than one-tenth of the wavelength ($\lambda$) of an electromagnetic radiation emitted by the components.

16. The shielding apparatus of claim 1, wherein the non-EMI-sensitive components are surface mounted devices.

17. The shielding apparatus of claim 1, wherein the first contact area includes a first shielding face through which first interfacial connections pass, and a second shielding face through which second interfacial connections pass.

* * * * *